United States Patent
Dahmani

(10) Patent No.: US 8,501,525 B2
(45) Date of Patent: Aug. 6, 2013

(54) METHOD OF FABRICATION OF PROGRAMMABLE MEMORY MICROELECTRIC DEVICE

(75) Inventor: Faiz Dahmani, La Varenne-Saint Hilaire (FR)

(73) Assignee: Altis Semiconductor, Corbeil Essonnes (FR)

( * ) Notice: Subject to any disclaimer, the term of this patent is extended or adjusted under 35 U.S.C. 154(b) by 62 days.

(21) Appl. No.: 13/150,351

(22) Filed: Jun. 1, 2011

(65) Prior Publication Data
US 2011/0297910 A1 Dec. 8, 2011

(30) Foreign Application Priority Data
Jun. 4, 2010 (FR) ...................................... 10 54391

(51) Int. Cl.
*H01L 21/00* (2006.01)
*G11C 11/24* (2006.01)

(52) U.S. Cl.
USPC ............... 438/95; 438/97; 438/102; 438/103; 438/513; 365/148; 365/149; 257/2; 257/3; 257/4; 257/5; 257/E45.002; 257/E47.001; 257/E47.002

(58) Field of Classification Search
USPC ............... 438/95, 97, 102, 103, 513; 365/148, 365/149; 257/2, 3, 4, 5, E45.001, E45.002, 257/E47.001, E47.002
See application file for complete search history.

(56) References Cited

U.S. PATENT DOCUMENTS

| 6,084,796 | A | 7/2000 | Kozicki et al. | |
| 7,528,401 | B2 * | 5/2009 | Li | 257/2 |
| 8,062,694 | B2 * | 11/2011 | Pinnow et al. | 427/58 |
| 2003/0052330 | A1 | 3/2003 | Klein | |
| 2003/0068861 | A1 * | 4/2003 | Li et al. | 438/257 |
| 2009/0073743 | A1 * | 3/2009 | Kasko et al. | 365/149 |
| 2011/0121254 | A1 * | 5/2011 | Dressler et al. | 257/4 |

FOREIGN PATENT DOCUMENTS
WO WO 2010/012683 * 2/2010

OTHER PUBLICATIONS

Search Report dated Jan. 17, 2011.
Evidence for nanoscale separation of stressed-rigid glass, 2003.
Rigidity transitions in binary Ge-Se glasses and the intermediate phase, 2001.
Nature of Glass Transition in Chalcogenides Dec. 2002.

* cited by examiner

Primary Examiner — Dao H Nguyen
(74) Attorney, Agent, or Firm — Sofer & Haroun, LLP

(57) ABSTRACT

A method of fabricating a programmable memory microelectronic device includes depositing onto a first electrode an intermediate layer of a material having a chalcogenide; depositing an ionizable metallic layer on the intermediate layer; irradiating with ultraviolet radiation the ionizable metallic layer so that metallic ions from the ionizable metallic layer diffuse into the intermediate layer to form a chalcogenide material containing metallic ions, and depositing a second electrode on the layer of chalcogenide material containing metallic ions obtained in the prior step. The second and third steps are repeated at least n times, where n is an integer greater than or equal to 1. The ionizable metallic layer deposited during the second step has a sufficiently small thickness that the metallic ions may be diffused totally during the irradiation (third) step.

16 Claims, 4 Drawing Sheets

METHOD OF FABRICATION OF PROGRAMMABLE MEMORY MICROELECTRIC DEVICE

RELATED APPLICATION

This application claims the benefit of priority from French Patent Application No. 10 54391, filed on Jun. 4, 2010, the entirety of which is incorporated by reference.

BACKGROUND OF THE INVENTION

The present invention relates to a method of fabrication of a programmable memory microelectronic device and a programmable memory microelectronic device obtained by said method.

It applies typically, but not exclusively, to the fabrication of ionic conduction (metallization) programmable cells known as non-volatile computer memories. These ionic conduction programmable cells are well known as CBRAM (Conductive-Bridging Random Access Memory) or PMC (Programmable Metallization Cells).

DESCRIPTION OF THE PRIOR ART

This type of microelectronic structure (CBRAM or PMC) is well known to the person skilled in the art and is for example described in the document U.S. Pat. No. 6,084,796.

A CBRAM (or PMC) typically includes a layer (or solid electrolyte) of chalcogenide glass doped with a metallic element, preferably silver, interleaved between two electrodes. These electrodes are configured to cause growth of a metallic dendrite (i.e. formation of an electrical conduction bridge) from the negative of the two electrodes toward the positive of the two electrodes through the layer of doped chalcogenide glass when a voltage is applied between said electrodes. By applying an opposite voltage between these two electrodes, the inverse phenomenon is obtained, namely disappearance of the metallic dendrite (i.e. disappearance of the electrical conduction bridge) within the layer of doped chalcogenide glass.

Thus when the electrical conduction bridge is created (this is called a "writing" step), the logic state of the device may be represented by "1" or may correspond to the "ON" state, whereas when the electrical conduction bridge disappears, the logic state of the cell may be represented by "0" or may correspond to the "OFF" state.

One of the conventional techniques for fabricating this type of microelectronic device is to dope the chalcogenide glass with a metallic element, such as silver, for example, using ultraviolet (UV) radiation. The term photo-doping is commonly used. The metallic element then diffuses into the layer of chalcogenide glass to form a chalcogenide glass doped with a metallic element and thus to form the solid electrolyte.

More specifically, it is common to bring about the photo-dissolution of the metal by depositing a single layer of silver, of relatively high thickness, notably greater than 15 nanometers (nm), onto the layer of chalcogenide glass (the latter having been deposited beforehand onto a first electrode), and then to irradiate this structure with ultraviolet radiation.

There may equally be cited the document US 2009/0073743 which also describes the use of a layer of silver of relatively high thickness, which may range from 10 nm to 15 nm, for the fabrication of a programmable memory microelectronic device. Said device notably comprises an inert electrode composed of tungsten onto which is deposited a conductive intermediate layer of ions of silver-doped chalcogenide type. This intermediate layer is covered by a reactive second electrode composed of silver. The intermediate layer of silver-doped chalcogenide is obtained by photo-doping a chalcogenide material with silver. The photo-doping of silver is effected from a layer of silver deposited on the chalcogenide material, the thickness of which layer may range from 10 to 15 nm, said layer of silver being irradiated with radiation at a wavelength of 405 nm with a power density of 115 mW/cm² for 20 minutes.

Another method consists in bringing about the photo-dissolution of the metal by repeating the deposition and irradiation steps in order to increase the quantity of ionizable metal within the chalcogenide glass, the layer of ionizable metal having a thickness that may range from 1 to 40 nm. This variant is described in the document FR 2 934 711.

Once these deposition and irradiation operations have finished, a second electrode, for example in silver, is in turn deposited on the layer of chalcogenide glass doped in this way.

These photo-doping methods have numerous drawbacks, however.

After the step of conventional ultraviolet irradiation, a residual layer of silver remains on the surface of the layer of doped chalcogenide glass when the photo-doping operation has been effected, whether this photo-doping operation was effected in one step or in a plurality of repeated steps.

Furthermore, if she deposited metal layer is relatively thick, notably at least 10 nm thick, even at least 15 nm thick, with this thickness it is not possible to optimize the diffusion of the metallic layer into the chalcogenide glass because it forms a "screen" that attenuates the penetration of the ultraviolet radiation and thus attenuates the diffusion of the metallic element. This problem also arises when a residual metallic layer is present on she layer of doped chalcogenide glass, even a thin layer, notably at most 15 nm thick.

Moreover, these photo-doping methods are in no way optimized to achieve a high concentration of metallic elements in the layer of chalcogenide glass, which limits the rate of formation and disappearance of the electrical conduction bridge in the operational configuration of the microelectronic device.

Finally, these photo-doping methods are conventionally executed at high power, for example with an ultraviolet radiation intensity of around 1000 mW/m², or for an irradiation time (photodissolution step) of the order of 20 minutes, which is too long, leading to the formation of structural defects within and on the surface of the layer of chalcogenide glass, as well as within and on the surface of the residual ionizable metallic layer.

More specifically, these defects are typically clumps of the metallic element, notably clumps of silver when the metallic layer is a layer of silver, which on the one hand induces heterogeneous physico-chemical properties of the microelectronic device and on the other hand induces a roughness of the surface of the layer of chalcogenide glass and the residual silver layer (topology problem).

Because of this, the performance of the programmable memory microelectronic device is degraded and short circuits may even occur in the operational configuration of said device.

SUMMARY OF THE INVENTION

The object of the present invention is to palliate the drawbacks of the prior art techniques, in particular by proposing a method of fabricating a programmable memory microelectronic device using the ultraviolet irradiation (or photo-doping) technique to diffuse an ionizable metallic layer into a chalcogenide-based layer, making it possible to increase the concentration of metallic ions, coming from the ionizable metallic layer, within said chalcogenide-based layer, at the same time as significantly limiting (or even avoiding) the formation of metallic clumps in said device, and more particularly in the chalcogenide-based layer and in the metallic residual layer or layers.

The present invention provides a method of fabricating a programmable memory microelectronic device comprising the steps of:
i. depositing onto a first electrode an intermediate layer of a material containing a chalcogenide,
ii. depositing an ionizable metallic layer on the intermediate layer,
iii. irradiating with ultraviolet radiation the ionizable metallic layer so that metallic ions from the ionizable metallic layer diffuse into the intermediate layer to form a chalcogenide material containing metallic ions, and
iv. depositing a second electrode on the layer of chalcogenide material containing metallic ions obtained in step iii, and repeating steps ii and iii at least n times, where n is an integer greater than or equal to 1,
characterized in that the ionizable metallic layer deposited during step ii has a sufficiently small thickness that said metallic ions may be diffused totally during the irradiation step iii.

DESCRIPTION OF THE PREFERRED EMBODIMENTS

In a particularly preferred embodiment $n \geq 5$, preferably $n \geq 7$, and especially preferably $n \leq 20$.

Research carried out by the applicant has surprisingly shown that repeating steps ii and iii associated with the total diffusion of each of the deposited ionizable metallic layers has the advantage of making it possible to limit significantly the formation of structural defects linked to the metallic elements within the programmable memory microelectronic device, thus optimizing the homogeneity of the physico-chemical properties of the doped intermediate layer.

Moreover, the photo-doping method of the invention makes it possible to achieve a high metallic element concentration in the chalcogenide glass layer and thus significantly optimizes the rates of formation and disappearance of the electrical conduction bridges in the operational configuration of the programmable cell.

The expression "diffused totally" as used above refers to total diffusion of the metallic ions (coming from the ionizable metallic layer) through the intermediate layer so that substantially no metallic layer remains on the surface of the intermediate layer after each irradiation step iii.

Thus the steps ii and iii are repeated in such a manner that each metallic layer of step ii is deposited on an intermediate layer substantially free of the previously deposited ionizable metallic layer.

The person skilled in the art will easily be able to verify using well-known techniques, for example using a transmission electron microscope (TEM), that the doped intermediate layer is substantially free of any residual (ionizable) metallic layer on its surface. TEM measurements are conventionally carried out at room temperature (of the order of 25° C.), but may equally be carried out at a temperature below 25° C., and more particularly at a temperature below 0° C. if the ionizable metallic layer has a high ionic mobility, notably a high ionic mobility at room temperature.

Each ionizable metallic layer may be considered to be totally diffused after the irradiation step iii (i.e. that there is no residual metallic layer after each irradiation step iii) when it has a thickness of at most 0.5 nm and preferably of at most 0.2 nm. In other words, after each step iii, the ionizable metallic layer will in particular have a thickness of at most 0.5 nm and preferably of at most 0.2 nm.

In a particularly preferred example, the ionizable metallic layer of the invention may be deemed to have diffused totally when the sum of the thicknesses of all the diffused ionizable metallic layers does not exceed 0.5 nm and preferably 0.2 nm. In other words, after the last step iii, the ionizable metallic layer has a thickness of at most 0.5 nm and preferably of at most 0.2 nm.

Of course, because repeating steps ii and iii makes it possible to obtain a high concentration of metallic ions in the intermediate layer, the increase in the metallic ion concentration as steps ii and iii are repeated must not significantly affect the initial physico-chemical properties of the intermediate layer. Thus the person skilled in the art should preferably chose an optimized ultraviolet radiation intensity and/or exposure time to avoid any residual metallic layer.

The Intermediate Layer and its Deposition

The doped intermediate layer of the invention is typically intended to form the solid electrolyte of the programmable memory microelectronic device.

The material of the intermediate layer is notably an amorphous material. Thus when it is stated that the initial physico-chemical properties of the intermediate layer are not significantly affected by steps ii and iii, this means that the initially amorphous material must remain substantially amorphous after said steps ii and iii.

The material of the intermediate layer contains a chalcogenide and is preferably a chalcogenide glass.

A chalcogenide is a chemical compound comprising at least one chalcogen ion and at least one electropositive element.

Chalcogenides are in group 16 of the periodic table of the elements and those preferably used in the invention are sulfur (S), selenium (Se) and tellurium (Te).

The electropositive element of the chalcogenide may notably be an element from group 14 or group 15 of the periodic table of the elements, preferably germanium (Ge) or arsenic (As).

There may be cited, by way of examples of chalcogenides, germanium selenide germanium sulphide $Ge_xS_{100-x}$, and arsenic sulphide $As_xS_{100-x}$, where x is an integer, notably in the range 18 to 50.

The preferred chalcogenide is germanium sulfide $Ge_xS_{100-x}$, notably with $33 \leq x \leq 44$, and particularly preferably with $x=40$.

The intermediate layer may typically be deposited by a process well known to the person skilled in the art such as cathode sputtering.

For example, the thickness of the intermediate layer may be 15 to 100 nm, and preferably 20 to 50 nm.

The Ionizable Metallic Layer and its Deposition

The ionizable metallic layer of the invention is a layer comprising a metallic element intended so dope the intermediate layer. The metallic layer preferably contains only one metallic element or a plurality of metallic elements (i.e. an alloy), and more preferably contains only one metallic element.

The metallic element may be chosen from silver (Ag), copper (Cu) and zinc (Zn), or mixtures thereof, the particularly preferred embodiment being silver or a silver alloy.

The ionizable metallic layer is relatively thin, which allows better penetration of the ultraviolet radiation through this layer, as well as total dissolution (diffusion) of this layer during step iii.

For example, the thickness of the ionizable metallic layer is preferably strictly less than 10 nm, preferably less than or equal to 8 nm, preferably less than or equal to 5 nm, preferably less than or equal to 3 nm, preferably less than or equal to 2 nm, preferably of the order of 1.5 nm. It is notably preferable if the thickness of the ionizable metallic layer of step ii is greater than or equal to 0.5 nm.

Step ii of the invention may preferably be carried out by cathode sputtering, notably in argon.

In a first particular embodiment relating to the deposition of the ionizable metallic layer, whether deposition is effected by cathode sputtering or not, this deposition onto the surface of the intermediate layer in step ii may advantageously be carried out at a temperature below 0° C., preferably at a temperature from −5° C. to −40° C., and particularly preferably at a temperature from −5° C. to −25° C.

Above zero degrees, for example at 24° C., the growth of the ionizable metallic layer may be affected. The layer deposited in this way may become rough and contain large grains of the metallic element (with a size of the order of 40 nm, for example), depending on the power applied to carry out deposition.

The temperature of the deposition step is conventionally that of the support (or wafer-carrier) on which the multilayer (or multi-wafer) device that is to undergo this step is placed.

Before the step ii the multilayer device comprises at least the first electrode (first layer) onto which the intermediate layer of a material comprising a chalcogenide (second layer) has been deposited.

Considering deposition by cathode sputtering at a given deposition power density (e.g. 0.11 h/cm$^2$), the roughness and the size of the grains of the ionizable metallic layer deposited at a temperature of 24° C. are much greater than those obtained with a temperature below 0° C., notably −20° C. Such roughness associated with a large grain size considerably limits the electrical performance of the microelectronic device.

Thus depositing the ionizable metallic layer at a temperature below 0° C. guarantees a homogeneous microstructure with significantly reduced roughness and grain size.

In a second particular embodiment relating to the deposition of the ionizable metallic layer, which is notably effected by cathode sputtering, this deposition on the surface of the intermediate layer in step ii may advantageously be effected with a (DC or RF) power density below 0.58 W/cm$^2$, preferably in the range 0.023 W/cm$^2$ to 0.35 W/cm$^2$, and particularly preferably in the range 0.058 W/cm$^2$ to 0.17 W/cm$^2$.

This upper limit of 0.58 W/cm$^2$ makes it possible to guarantee a relatively low rate of deposition so as to control more easily the growth of the ionizable metallic layer and its microstructural quality.

Moreover, the power density defined in this way in this second embodiment advantageously makes it possible to deposit a relatively thin ionizable metallic layer, notably of thickness less than or equal to 2 nm.

For a given deposition temperature (e.g. 24° C.), the roughness and the grain size of the ionizable metallic layer deposited with a power density of 1.16 W/cm$^2$ are much lower than those obtained with a power of 0.11 W/cm$^2$. However, with a power density greater than 0.58 W/cm$^2$ (e.g. 1.16 W/cm$^2$), it becomes difficult to control the stability of the deposited layer, which affects the quality of the deposit.

Of course, combining the first and second embodiments relating to the deposition of the ionizable metallic layer makes it possible to optimize significantly the quality of the deposit of the ionizable metallic layer (stable layer), namely to guarantee optimum grain size and optimum roughness (i.e. the lowest possible values, of grain size and roughness), at the same time as controlling the growth of said deposit.

Of course, other deposition methods may be used in the context of the invention.

UV Irradiation

The ultraviolet irradiation step makes it possible to diffuse metallic ions coming from the ionizable metallic layer through the intermediate layer in order to form a doped intermediate layer, in other words to form a chalcogenide material containing metallic ions.

In step iii, the ultraviolet, radiation intensity ($I_{UV}$) and irradiation time ($t_{UV}$) are adjusted by the person skilled in the are to allow total diffusion of the ionizable metallic layer.

To limit or even avoid significant formation of structural defects induced by the metallic ions, the ultraviolet radiation intensity ($I_{UV}$) of step iii may advantageously be at most 150 mW/cm$^2$ and preferably at least 10 mW/cm$^2$.

In one particular embodiment, the UV irradiation time ($t_{UV}$) of step iii is from 30 to 120 seconds (s) and is preferably of the order of 90 seconds.

Steps ii and iii are repeated so that each deposited metallic layer of step ii may be irradiated with the same or different $I_{UV}$ and/or with the same or different $t_{UV}$.

Of course, the person skilled in the art may vary these two parameters to obtain the same result; in particular the power could exceed 150 mW/cm$^2$, but the time of exposure to the ultraviolet radiation must then be limited (less than 30 s). Conversely, the power could be below 10 mW/cm$^2$, but the time of exposure to the ultraviolet radiation must then be increased (more than 120 s).

First and Second Electrodes

The first and second electrodes are notably metallic electrodes produced and deposited by techniques well known to the person skilled in the art. They respectively correspond to an anode and a cathode, or vice-versa.

More particularly, for CBRAM (or PMC), these two electrodes are configured to cause growth of a metallic dendrite (i.e. formation of an electrical conduction bridge) from the negative of she two electrodes toward the positive of the two electrodes through the doped intermediate layer when voltage is applied between said electrodes. Applying an opposite voltage between these two electrodes produces the opposite phenomenon, namely disappearance of the metallic dendrite (i.e. disappearance of the electrical conduction bridge) within the doped intermediate layer.

The first electrode may typically be a nickel, tungsten, nickel alloy or tungsten alloy electrode.

The second electrode is typically a silver or silver alloy electrode.

Moreover, the first electrode may in the conventional way be deposited on a layer of substrate well known to the person skilled in the art. The substrate may for example be a combination of semiconductor material and/or components.

Additional Step

The method of the invention may further comprise the step of heating the intermediate layer to a temperature less than or equal to the glass transition temperature of said intermediate layer, this step being carried out before step ii.

This step is preferably carried out at a temperature above 25° C. This step is typically referred to as a high-temperature heat treatment step (i.e. a curing step).

The glass transition temperature of the intermediate layer of the invention may be measured by modulated differential scanning calorimetry (MDSC) using a temperature ramp of 3° C./min and a modulation rate of 1° C./100 s.

For example, the documents "P. Boolchand, X. Fenq, W. J. Bresser. *Rigidity transition in binary Ge-Se glasses and intermediate phase. J. Non-Cryst. Solids.*, 293, 348 (2001)"; "P. Boolchand, D. E. Georgiev, M. Micoulaut. *Nature of glass transition in chalcogenides. Journal of Optoelectronics and Advanced Materials*, Vol. 4, No. 4, 823 (2002)"; and "S. Mamedov, D. E. Georgiev, Tao Qu and P. Boochland. *Evidence for nanoscale phase separation of stressed-rigid glasses.* J. Phys.: Condens. Matter 15 (2003)" give examples of glass transition temperatures of chalcogenide glass.

The heat treatment (or curing) step may be effected concomitantly with and/or after step i.

When this heat treatment step is effected concomitantly with step i, it is generally the support (or wafer-carrier) on which the multilayer (or multi-wafer) device is placed that is heated to a temperature less than or equal to the glass transition temperature of the intermediate layer.

When this heat treatment step is effected after step i, the multilayer device may be placed in an oven enabling said device to be heated to a temperature less than or equal to the glass transition temperature of the intermediate layer.

Before step ii the multilayer device comprises at least the first electrode (first layer) onto which has been deposited the intermediate layer of a material containing a chalcogenide (second layer).

This additional step advantageously makes it possible to increase the density of the intermediate layer before the UV irradiation step iii in order to stabilize it and to reduce significantly or even prevent unwanted subsequent migration or diffusion of the metallic ions of the doped intermediate layer.

Furthermore, it is well known that the dissolution (diffusion) of metallic ions, for example silver ions, into a chalcogenide-based solid layer tends to reduce the glass transition temperature of the chalcogenide doped in this way. The subsequent steps of fabrication of the microelectronic device, which may necessitate other heat treatment steps, are limited in terms of temperature rise. If the glass transition temperature of the chalcogenide (whether doped or not) is exceeded, its originally amorphous structure begins to crystallize and thus loses its initial intrinsic physico-chemical properties.

In the prior art, this high-temperature heat treatment step is commonly carried out after the step of irradiating the metallic layer with ultraviolet radiation in order not to limit photo-diffusion of metallic ions into the intermediate layer, despite the aforementioned drawback. The heat treatment making the intermediate layer more dense, it is known that it becomes difficult when using the prior art methods to optimize diffusion of the metallic ions into a layer of chalcogenide that has already been heat treated.

Moreover, when this heat treatment step is carried out after the UV irradiation step, and notably when the ionizable metallic layer has not completely diffused after irradiation, it is common to encounter structural defects linked to the metallic elements (e.g. formation of metallic clumps) at the surface of and even within the intermediate layer, since the heat treatment may lead to uncontrollable migration of the metallic elements.

Thanks to the fabrication method of the invention, it then becomes possible to carry cut the heat treatment step before the UV irradiation step (i.e. diffusion of metallic ions into the intermediate layer), without diffusion being limited because of the densification phenomenon, and without formation of said structural defects linked to the metallic elements.

In one particular embodiment, the temperature of this additional (heat treatment) step may range from 150° C. to 450° C., preferably from 200° C. to 400° C. given the glass transition temperature of the intermediate layer of chalcogenide (which depends on the initial stoichiometry of the chalcogenide).

Moreover, the duration of this additional step may be from 5 to 30 minutes and preferably from 5 to 15 minutes.

Another object of the invention relates to a programmable memory microelectronic device produced by the method of the present invention as defined herein.

Thus the structure comprises a doped intermediate layer of the invention as defined herein, interleaved between two electrodes, said intermediate layer having the particular feature of including a higher concentration of metallic elements (i.e. metallic ions) than a doped intermediate layer obtained as in the prior art by a photo-doping method from an intermediate layer and a metallic layer both of the same kind.

Moreover, another advantage of this structure is that the intermediate layer, once photo-doped by the method of the invention, includes a significantly reduced number of defects linked to the diffused metallic elements, or even none at all.

In a preferred embodiment, the programmable memory microelectronic device of the invention is an ionic conduction programmable cell (CBRAM or PMC), which type of structure is described hereinabove.

BRIEF DESCRIPTION OF THE DRAWINGS

Other features and advantages of the present invention will become apparent on reading the following examples with reference to the appended figures, said examples and figures being provided by way of nonlimiting illustration.

EXAMPLES

Method 1/Ag15 nm-UV-5 min (Comparative Method)

After producing a first electrode of the tungsten electrode type, a layer 30 nm thick of a chalcogenide glass of type $Ge_{40}S_{60}$ is deposited onto the surface of said first electrode. The chalcogenide glass is deposited by cathode sputtering in an argon atmosphere.

A thickness of 15 nm of silver ($AG^{(0)}$ is then deposited onto the layer of chalcogenide glass by cathode sputtering in an argon atmosphere at room temperature (i.e. 25° C.) (temperature of the wafer-carrier).

The silver layer is then irradiated by ultraviolet radiation with an intensity $I_{UV}$ of 20 mW/cm$^2$ for minutes in order for the silver ions ($Ag^+$) to diffuse into the layer of chalcogenide glass. There is then formed a layer of chalcogenide glass containing silver ions (i.e. a layer of chalcogenide class doped with silver ions).

Finally, a second electrode of the silver electrode type is deposited onto this layer of doped chalcogenide glass.

This method 1 thus illustrates the prior art method consisting in effecting only one sequence of deposition and UV irradiation of a layer of sliver.

Method 1 bis/Ag10 nm-UV-20 min (Comparative Method)

After producing a first electrode of the tungsten electrode type, a layer 30 nm thick of a chalcogenide glass of type $Ge_{40}S_{60}$ is deposited onto the surface of said first electrode. The chalcogenide glass is deposited by cathode sputtering in an argon atmosphere.

A thickness of 10 nm of silver ($Ag^{(0)}$) is then deposited onto the layer of chalcogenide glass by cathode sputtering in an argon atmosphere at room temperature (i.e. 25° C.) (temperature of the wafer-carrier).

The silver layer is then irradiated by ultraviolet radiation with an intensity of 115 mW/cm$^2$ for 20 minutes in order for the silver ions ($Ag^+$) to diffuse into the layer of chalcogenide glass. There is then formed a layer of chalcogenide glass containing silver ions (i.e. a layer of chalcogenide glass doped with silver ions).

Finally, a second electrode of the silver electrode type is deposited onto this layer of doped chalcogenide glass.

This method 1 bis illustrates the prior art method corresponding to the document US 2009/0073743.

Figure 1:
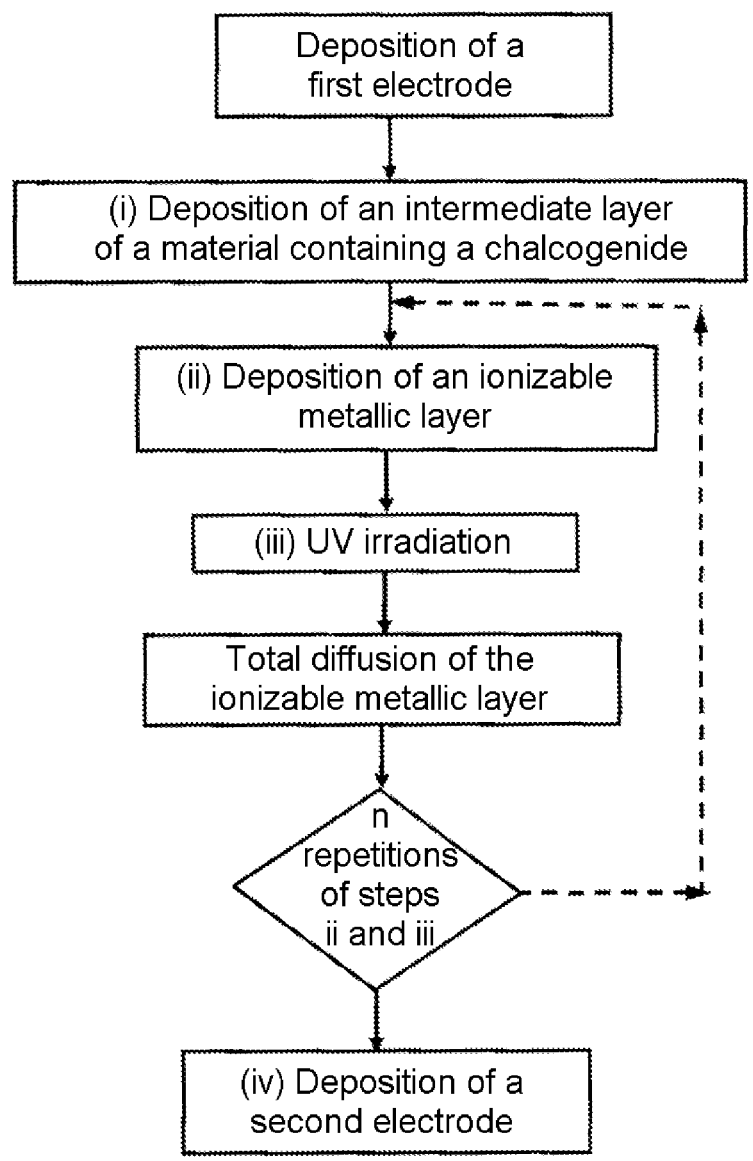
FIG. 1 represents a flowchart of she method of the invention of fabricating a programmable memory microelectronic device.

Methods 2 and 3 are described next with reference to FIG. 1.

Method 2/6x(Ag1.5 nm-UV-90s) (Method of the Invention)

After producing a first electrode of the tungsten electrode type a layer 30 nm thick of a chalcogenide glass of type $Ge_{40}S_{60}$ is deposited onto the surface of said first electrode. The chalcogenide glass is deposited as described for method 1.

In a first step, a thickness of 1.5 nm of silver ($Ag^{(0)}$) is first deposited by cathode sputtering onto the chalcogenide glass layer. This cathode sputtering is effected in a Widebody-Durasource reactor incorporated in an Applied Materials Endura 5500 equipment at a temperature of −25° C. (wafer-carrier temperature) and with a DC power density of 0.11 W/cm$^2$ (this power density corresponds to a power of 100 W for a 33 cm diameter cathode sputtering target, the diameter of the layer of chalcogenide glass being 20 cm). The silver layer is then irradiated with ultraviolet, radiation at an intensity $I_{UV}$ of 20 mW/cm$^2$ for 90 seconds in order for the silver ions ($Ag^+$) to diffuse into the chalcogenide glass layer. A chalcogenide glass layer is then formed containing silver ions (i.e. a layer of chalcogenide glass doped with silver ions). Following this UP irradiation, the silver layer deposited during this step is completely dissolved and diffused into the chalcogenide glass.

In a second step, a thickness of 1.5 nm of silver is first deposited by cathode sputtering onto the layer of doped chalcogenide glass obtained during the first step referred to above. Cathode sputtering is effected under the same conditions as said first step. The silver layer is then irradiated with ultraviolet radiation with an intensity of 20 mW/cm$^2$ for 90 seconds in order for the silver ions to diffuse into the previously doped chalcogenide glass layer. A layer of chalcogenide glass is then formed containing silver ions, the metallic silver concentration of which is greater than that of the doped chalcogenide glass of the first step. Of course, following this irradiation, the layer of silver deposited during this step is completely dissolved and diffused into the chalcogenide glass.

This second step, the experimental conditions of which are identical to those of the first step, is then repeated four times.

Of course, each layer of silver deposited is totally dissolved and diffused in the chalcogenide layer after each CV irradiation step.

Consequently, the layer of chalcogenide glass has been doped six times (n=5) with a cumulative total thickness of silver equivalent to six times 1.5 nm, namely 9 nm.

Finally, a second electrode of the silver electrode type is deposited onto this layer of doped chalcogenide glass.

Method 3/8x(Ag1.5 nm-UV-90s) (Method of the Invention)

Method 3 is identical in all respects to the method 2 described above except that the second step is repeated six times.

Consequently, the layer of chalcogenide glass has been doped eight times (n=7), with a total cumulative thickness of silver equivalent to eight times 1.5 nm, namely 12 nm.

Figure 2:
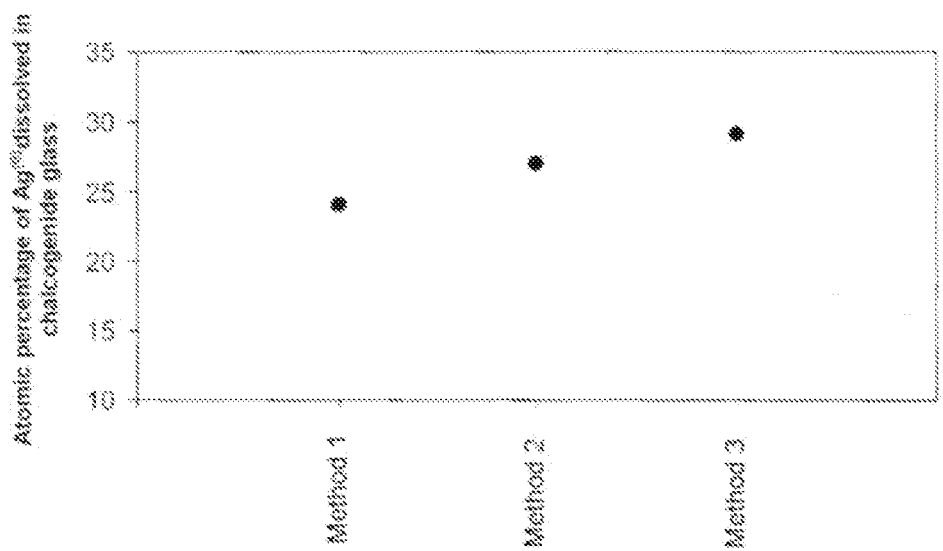
FIG. 2 represents the atomic percentage of silver dissolved in a chalcogenide glass by photo-doping as in the prior art and as in accordance with the present invention.

The FIG. 2 graph shows the results for the atomic percentages of silver in the chalcogenide layers obtained by methods 1, 2 and 3.

Accordingly, methods 2 and 3 of the invention make it possible to obtain a silver concentration (respectively of 27 and 29 at. %) much higher than that obtained with method 1, whilst using a much smaller quantity of silver with respect to the total thickness of the silver layer or layers used (method 1: total thickness 15 nm; method 2: total thickness (cumulative) 9 nm; method 3: total thickness (cumulative) 12 nm).

Furthermore, transmission electron microscopy clearly shows that method 1 and method 1 bis leave a residual layer of silver of 10 nm thickness (for method 1) and at least 2 nm thickness (for method 1 bis) after the UV irradiation step, whereas methods 2 and 3 do not have this feature.

Thus the initial thicknesses of the silver layer (methods 1 and 1 bis) for doping the chalcogenide glass layer are not sufficiently small for the silver ions to be diffused totally when irradiated.

The operating conditions for transmission electron microscopy observation are as follows.

Transmission electron microscopy observation conventionally comprises a preliminary step of preparing the multilayer device to be observed, including a polishing step followed by a step of filling said multilayer device using a focused beam of ions. The voltage of the focused beam of ions is notably at most 30 kV.

The multilayer devices observed are of course those produced using methods 1 to 3 but without the second electrode.

Because the ionizable metallic layer used is a layer of silver, the ionic mobility of which is high, to optimize the quality of the measurements it is necessary to deposit a layer of titanium (for example 25 nm thick) and then a layer of titanium nitride (for example 50 nm thick) onto the microelectronic device obtained once the single step iii has finished (in the case of method 1 and method 1 bis) or the final step iii has finished (in the case of methods 2 and 3).

Also to optimize the measurements, the multilayer device created in the above manner is deposited onto a sample-carrier at a temperature below 0° C., notably −175° C.

Scanning electron microscope (SEM) micrographs have been produced using a Physical Electronics PHI670 scanning electron microscope at a voltage of 10 kV, a current of 10 nA and an electron beam size of 50 nm.

These SEM micrographs show the presence of aggregates of silver on the surface of the chalcogenide layer doped by method 1 or method 1 bis, which is no way the case in the SEM micrographs of the chalcogenide layers doped by methods 2 and 3

Accordingly, thanks to the method of the invention, as the succession of deposition and UV irradiation steps progresses, the silver ion concentration increases, at the same time as guaranteeing optimum and homogeneous diffusion of the silver into the chalcogenide layer, significant reduction of structural defects linked to the silver, and unchanged physicochemical properties of the chalcogenide glass (the chalcogenide glass retaining its amorphous properties).

Method 4/Heat Treatment at Different Temperatures

In order to show that the heat treatment preceding the steps of deposition and CV irradiation of the silver layer does not block penetration and total diffusion of the silver ions into the layer of chalcogenide glass of type $Ge_{40}S_{60}$, the applicant has compared the atomic percentage of silver in the chalcogenide layer obtained by method 3 to the atomic percentage of silver in a chalcogenide layer obtained by a method 4 corresponding to method 3 incorporating an additional step of heat treatment according to the present invention.

Figure 3:
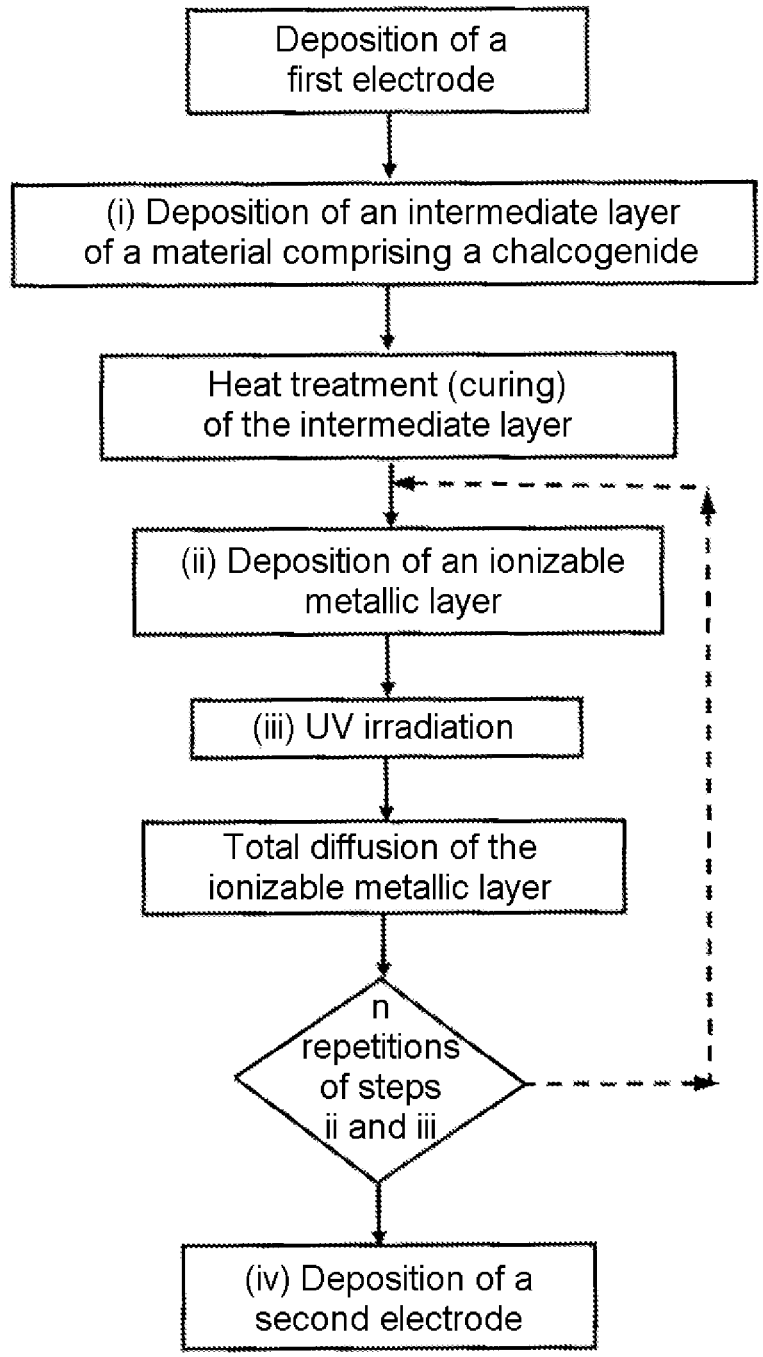
FIG. 3 represents a flowchart of one particular embodiment of the method of the invention of fabricating a programmable memory microelectronic device.

Method 4 of the invention is described next with reference so FIG. 3.

A 30 nm thick layer of a chalcogenide glass of the $Ge_{40}S_{60}$ type (which has a glass transition temperature of 370° C.) is deposited onto the surface of a first electrode of the tungsten electrode type. The chalcogenide glass is deposited in the manner described for method 1.

The first electrode together with the layer of chalcogenide glass is then placed in an oven to "cure" at high temperature said layer of chalcogenide glass as yet not doped (in other words, to heat the chalcogenide glass to a temperature below its glass transition temperature), in order to increase its density.

After densification of the chalcogenide glass layer, there follow the steps of deposition and UV irradiation of the layer of silver, in the same manner in method 4 as described above for method 3: thus the chalcogenide glass layer is doped eight times, with a total thickness of silver equivalent to eight times 1.5 nm, namely 12 nm.

Once the doping sequences have been effected second electrode of the silver electrode type is deposited on this layer of doped chalcogenide glass, as in method 3.

The heat treatment step of method 4 was carried out at different temperatures:
  heat treatment at 200° C. (method 4a), before the eight doping sequences;
  heat treatment at 250° C. (method 4b), before the eight doping sequences; and
  heat treatment at 300° C. (method 4c), before the eight doping sequences.

The higher the heat treatment (i.e. curing) temperature, whilst remaining below the glass transition temperature of the layer of chalcogenide glass, the greater the density of the chalcogenide and the better its thermal stability.

Figure 4:
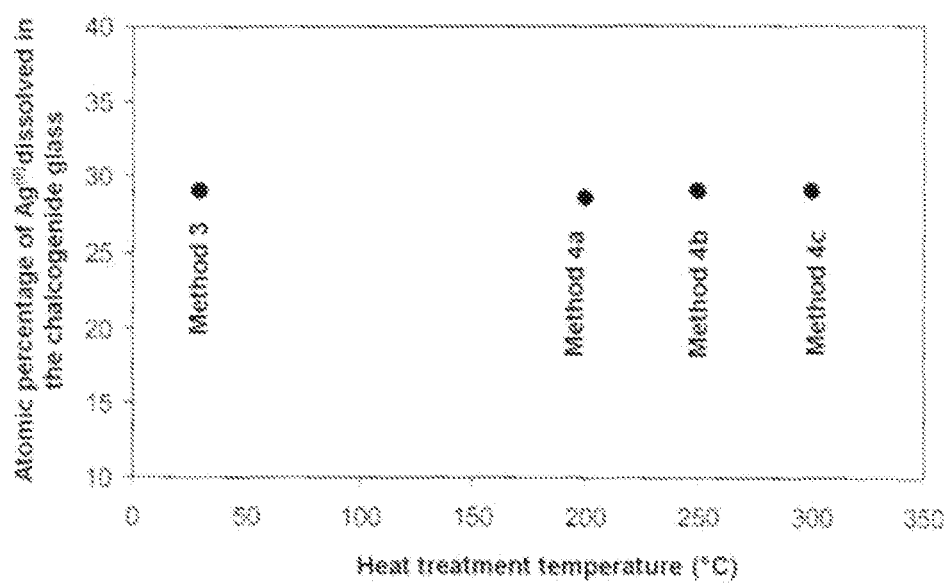
FIG. 4 represents the atomic percentage of silver dissolved in a chalcogenide glass by photo-doping in accordance with the present invention, including or not including a step of heat treatment before photo-doping.

FIG. 4 represents the atomic percentage of silver ($Ag^{(0)}$) in the layer of chalcogenide glass of the $Ge_{40}S_{60}$ type obtained using methods 3, 4a, 4b and 4c, respectively.

Thus it is clearly apparent that diffusion in accordance with the present invention of silver ions into the chalcogenide is in no way affected by the heat treatment step as the atomic percentage of silver remains identical (i.e. 29 at. %) in methods 3, 4a, 4b and 4c.

The invention claimed is:

1. A method of fabricating a programmable memory microelectronic device comprising the steps of:
   i. depositing onto a first electrode an intermediate layer of a material containing a chalcogenide;
   ii. depositing an ionizable metallic layer on the intermediate layer, wherein the depositing is carried out using a power density below 0.58 W/cm$^2$;
   iii. irradiating with ultraviolet radiation the ionizable metallic layer so that metallic ions from the ionizable metallic layer diffuse into the intermediate layer to form a chalcogenide material containing metallic ions;
   iv. depositing a second electrode on the layer of chalcogenide material containing metallic ions obtained in step iii; and
repeating steps ii and iii at least n times, where n is an integer greater than or equal to 1, wherein the ionizable metallic layer deposited during step ii has a sufficiently small thickness that said metallic ions may diffuse totally during the irradiation step iii.

2. A method as claimed in claim 1, wherein n is greater than or equal to 5.

3. A method as claimed in claim 1, wherein after each step iii the ionizable metallic layer has a thickness of at most 0.5 nm.

4. A method as claimed in claim 1, wherein after the last step iii the ionizable metallic layer has a thickness of at most 0.5 nm.

5. A method according to claim 1, wherein the material of the intermediate layer is a chalcogenide glass.

6. A method as claimed in claim 1, wherein the chalcogenide is $Ge_xS_{100-x}$.

7. A method as claimed in claim 1, wherein the ionizable metallic layer is a layer of silver or silver alloy.

8. A method as claimed in claim 1, wherein the thickness of the ionizable metallic layer is less than or equal to 2 nm.

9. A method as claimed in claim 1, wherein the step ii is carried out at a temperature below 0° C.

10. A method as claimed in claim 1, wherein the step ii is carried out by cathode sputtering.

11. A method as claimed in claim 1, wherein the intensity ($I_{UV}$) of the ultraviolet radiation of step iii is at most 150 mW/cm$^2$.

12. A method as claimed in claim 1, further comprising a step, carried out before step ii, of heating the intermediate layer to a temperature less than or equal to the glass transition temperature of said intermediate layer.

13. A method as claimed in claim 1, wherein the programmable memory microelectronic device is an ionic conduction programmable cell (CBRAM or PMC).

14. A programmable memory microelectronic device obtained by the method as defined in claim 1.

15. A method of fabricating a programmable memory microelectronic device comprising the steps of:
   i. depositing onto a first electrode an intermediate layer of a material containing a chalcogenide,
   ii. depositing an ionizable metallic layer on the intermediate layer, wherein the deposition is carried out at a temperature below 0° C.,
   iii. irradiating with ultraviolet radiation the ionizable metallic layer so that metallic ions from the ionizable metallic layer diffuse into the intermediate layer to form a chalcogenide material containing metallic ions, and
   iv. depositing a second electrode on the layer of chalcogenide material containing metallic ions obtained in step iii, and
repeating steps ii and iii at least n times, where n is an integer greater than or equal to 1, wherein the ionizable metallic layer deposited during step ii has a sufficiently small thickness that said metallic ions may diffuse totally during the irradiation step iii.

16. A method as claimed in claim 15, wherein the step ii is carried out using a power density below 0.58 W/cm$^2$.

* * * * *